(12) United States Patent
Hong

(10) Patent No.: US 10,339,887 B1
(45) Date of Patent: Jul. 2, 2019

(54) GATE DRIVER ON ARRAY CIRCUIT

(71) Applicant: WUHAN CHINA STAR OPTOELECTRONICS TECHNOLOGY CO., LTD., Wuhan, Hubei (CN)

(72) Inventor: Guanghui Hong, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/747,500

(22) PCT Filed: Jan. 5, 2018

(86) PCT No.: PCT/CN2018/071500
§ 371 (c)(1),
(2) Date: Jan. 25, 2018

(30) Foreign Application Priority Data

Dec. 8, 2017 (CN) .......................... 2017 1 1292669

(51) Int. Cl.
*G09G 3/36* (2006.01)
*G06F 3/041* (2006.01)

(52) U.S. Cl.
CPC ......... *G09G 3/3677* (2013.01); *G06F 3/0412* (2013.01); *G09G 2310/0283* (2013.01); *G09G 2310/061* (2013.01); *G09G 2320/0214* (2013.01)

(58) Field of Classification Search
CPC ......... G09G 3/3677; G09G 2310/0283; G09G 2310/061; G09G 2320/0214; G06F 3/0412
See application file for complete search history.

(56) References Cited

U.S. PATENT DOCUMENTS

2017/0337862 A1\* 11/2017 Geng ........................ G09G 3/20

\* cited by examiner

*Primary Examiner* — Charles V Hicks
(74) *Attorney, Agent, or Firm* — Hauptman Ham, LLP

(57) ABSTRACT

A gate driver on array (GOA) circuit of the present disclosure includes a current leakage limiting module. The current leakage limiting module limits current leakage of a first node to maintain a high level of the first node when an embedded touch display panel enters a stage in which signal interruption occurs and touch scanning is performed, further reducing risk of cascade failure and making the GOA circuit stable.

18 Claims, 7 Drawing Sheets

GATE DRIVER ON ARRAY CIRCUIT

BACKGROUND OF INVENTION

1. Field of Invention

The present disclosure relates to the field of liquid crystal displays, and more particularly to a gate driver on array (GOA) circuit.

2. Description of Prior Art

Gate driver on array (GOA) technology is a line driving technology of an array substrate, which fixes a gate scanning driving circuit on a thin film transistor (TFT) array substrate, using an array manufacturing process of a TFT liquid crystal display, achieving a driving mode for line-by-line scanning.

With development of an integrated touch panel, a display panel uses an embedded touch display. In the embedded touch display, a display refresh time is separated to free up time (namely TP SCAN: touch control stage) to perform touch scanning, thus, work status of the GOA circuit is not continuous, but a certain number of stages of GOA circuit are scanned for some time, further continuing scanning. In this way, when the status of the GOA circuit is maintained, current leakage becomes and issue, further causing cascaded failure of the GOA circuit and abnormal display.

SUMMARY OF INVENTION

The aim of the present disclosure is to provide a gate driver on array (GOA) circuit capable of limiting current leakage of the GOA circuit, reducing risk of cascaded failure, and making the GOA circuit stable.

The present disclosure provides a gate driver on array (GOA) circuit configured to be applied to an embedded touch display panel, where the GOA circuit comprises a plurality of cascaded stages of GOA units. An nth-stage GOA unit comprises a forward-and-reverse scanning control module, a node control module, an output module, an output control module, and a current leakage limiting module.

The forward-and-reverse scanning control module outputs a first node control signal to a first node and outputs a second node control signal to a second node according to a forward scanning direct-current control signal and a reverse scanning direct-current control signal.

The node control module is coupled to the first node and the second node. The node control module pulls the first node control signal down to a constant voltage low level, and pulls the second node control signal up to a constant high level voltage.

The output module is coupled to the first node, and a first clock signal is sent to the output module. The output module outputs a scanning signal according to the first node control signal and the first clock signal.

A first control signal is sent to the output control module, the output control module pulls the scanning signal down to a constant low level voltage according to the first control signal.

The current leakage limiting module is coupled to the first node; the current leakage limiting module limits current leakage of the first node to maintain a high level of the first node when the embedded touch display panel enters a stage in which signal interruption occurs and touch scanning is performed.

The output module comprises a tenth thin film transistor (TFT); the first clock signal is sent to a source electrode of the tenth TFT, a gate electrode of the tenth TFT is connected with the first node, and a drain electrode of the tenth TFT is connected with an output end of the output module.

In the GOA circuit of the present disclosure, the current leakage limiting module comprises a first TFT and a second TFT. A second control signal is sent to gate electrodes of the first TFT and the second TFT; source electrodes of the first TFT and the second TFT are electrically connected with the first node.

The reverse scanning direct-current control signal is sent to a drain electrode of the first TFT. The constant low level voltage is sent to a drain electrode of the second TFT.

In the GOA circuit of the present disclosure, when the embedded touch display panel displays normally, the second control signal is at a high level. When the embedded touch display panel enters the stage in which signal interruption occurs and touch scanning is performed, the second control signal is at a low level.

In the GOA circuit of the present disclosure, the current leakage limiting module comprises a first TFT.

The first control signal is sent to the source electrode and the drain electrode of the first TFT, and the drain electrode of the first TFT is electrically connected with the first node.

In the GOA circuit of the present disclosure, when the embedded touch display panel displays normally, the first control signal is at the low level. When the embedded touch display panel enters the stage in which signal interruption occurs and touch scanning is performed, the first control signal is at the high level.

In the GOA circuit of the present disclosure, the forward-and-reverse scanning control module comprises a third TFT, a fourth TFT, a fifth TFT, a first capacitor, and a second capacitor.

The forward scanning direct-current control signal is sent to a source electrode of the third TFT, a scanning signal of an (n−2)th-stage GOA unit is sent to a gate electrode of the third TFT, and a drain electrode of the third TFT is connected with the first node, a drain electrode of the fourth TFT, and a gate electrode of the fifth TFT.

The reverse scanning direct-current control signal is sent to a source electrode of the fourth TFT, and a scanning signal of an (n+2)th-stage GOA unit is sent to a gate electrode of the fourth TFT.

The constant low level voltage is sent to a source electrode of the fifth TFT, and a drain electrode of the fifth TFT is connected with the second node.

A first terminal of the first capacitor is connected with the first node, and the constant low level voltage is sent to a second terminal of the first capacitor.

A first terminal of the second capacitor is connected with the second node, and the constant low level voltage is sent to a second terminal of the second capacitor.

In the GOA circuit of the present disclosure, the node control module comprises a sixth TFT, a seventh TFT, an eighth TFT, and a ninth TFT.

A second clock signal is sent to a source electrode of the sixth TFT, the forward scanning direct-current control signal is sent to a gate electrode of the sixth TFT, and a drain electrode of the sixth TFT is connected with a gate electrode of the eighth TFT.

A third clock signal is sent to a source electrode of the seventh TFT, the reverse scanning direct-current control signal is sent to a gate electrode of the seventh TFT, and a drain electrode of the seventh TFT is connected with a gate electrode of the eighth TFT.

The constant high level voltage is sent to a source electrode of the eighth TFT, and a drain electrode of the eighth TFT is connected with the second node.

The constant low level voltage is sent to a source electrode of the ninth TFT, a gate electrode of the ninth TFT is connected with the second node, and a drain electrode of the ninth TFT is connected with the first node.

In the GOA circuit of the present disclosure, the output control module comprises an eleventh TFT and a twelfth TFT.

The constant low level voltage is sent to a source electrode of the eleventh TFT, a gate electrode of the eleventh TFT is connected with the second node, and a drain electrode of the eleventh TFT is connected with an output end of the output module.

The constant low level voltage is sent to a source electrode of the twelfth TFT, the first control signal is sent to a gate electrode of the twelfth TFT, and a drain electrode of the twelfth TFT is connected with the output end of the output module.

In the GOA circuit of the present disclosure, the nth-stage GOA unit further comprises a reset module; wherein the reset module comprises a thirteenth TFT; a reset signal is sent to a source electrode and a gate electrode of the thirteenth TFT, and a drain electrode of the thirteenth TFT is electrically connected with the second node.

The present disclosure provides a gate driver on array (GOA) circuit applying to an embedded touch display panel. The GOA circuit comprises a plurality of cascaded stages of GOA units. An Nth-stage GOA unit comprises a forward-and-reverse scanning control module, a node control module, an output module, an output control module, and a current leakage limiting module.

The forward-and-reverse scanning control module outputs a first node control signal to a first node and outputs a second node control signal to a second node according to a forward scanning direct-current control signal and a reverse scanning direct-current control signal.

The node control module is coupled to the first node and the second node; the node control module pulls the first node control signal down to a constant voltage low level, and pulls the second node control signal up to a constant high level voltage.

The output module is coupled to the first node, and a first clock signal is sent to the output module; the output module outputs a scanning signal according to the first node control signal and the first clock signal.

A first control signal is sent to the output control module, the output control module pulls the scanning signal down to a constant low level voltage according to the first control signal.

The current leakage limiting module is coupled to the first node; the current leakage limiting module limits current leakage of the first node to maintain a high level of the first node when the embedded touch display panel enters a stage in which signal interruption occurs and touch scanning is performed.

In the GOA circuit of the present disclosure, the current leakage limiting module comprises a first TFT and a second TFT.

A second control signal is sent to gate electrodes of the first TFT and the second TFT; source electrodes of the first TFT and the second TFT are electrically connected with the first node.

The reverse scanning direct-current control signal is sent to a drain electrode of the first TFT; the constant low level voltage is sent to a drain electrode of the second TFT.

In the GOA circuit of the present disclosure, when the embedded touch display panel displays normally, the second control signal is at a high level. When the embedded touch display panel enters the stage in which signal interruption occurs and touch scanning is performed, the second control signal is at a low level.

In the GOA circuit of the present disclosure, the forward-and-reverse scanning control module comprises a third TFT, a fourth TFT, a fifth TFT, a first capacitor, and a second capacitor.

The forward scanning direct-current control signal is sent to a source electrode of the third TFT, a scanning signal of an (n−2)th-stage GOA unit is sent to a gate electrode of the third TFT, and a drain electrode of the third TFT is connected with the first node, a drain electrode of the fourth TFT, and a gate electrode of the fifth TFT.

The reverse scanning direct-current control signal is sent to a source electrode of the fourth TFT, and a scanning signal of an (n+2)th-stage GOA unit is sent to a gate electrode of the fourth TFT.

The constant low level voltage is sent to a source electrode of the fifth TFT, and a drain electrode of the fifth TFT is connected with the second node.

A first terminal of the first capacitor is connected with the first node, and the constant low level voltage is sent to a second terminal of the first capacitor.

A first terminal of the second capacitor is connected with the second node, and the constant low level voltage is sent to a second terminal of the second capacitor.

In the GOA circuit of the present disclosure, the node control module comprises a sixth TFT, a seventh TFT, an eighth TFT, and a ninth TFT.

A second clock signal is sent to a source electrode of the sixth TFT, the forward scanning direct-current control signal is sent to a gate electrode of the sixth TFT, and a drain electrode of the sixth TFT is connected with a gate electrode of the eighth TFT.

A third clock signal is sent to a source electrode of the seventh TFT, the reverse scanning direct-current control signal is sent to a gate electrode of the seventh TFT, and a drain electrode of the seventh TFT is connected with a gate electrode of the eighth TFT.

The constant high level voltage is sent to a source electrode of the eighth TFT, and a drain electrode of the eighth TFT is connected with the second node.

The constant low level voltage is sent to a source electrode of the ninth TFT, a gate electrode of the ninth TFT is connected with the second node, and a drain electrode of the ninth TFT is connected with the first node.

In the GOA circuit of the present disclosure, the output control module comprises an eleventh TFT and a twelfth TFT.

The constant low level voltage is sent to a source electrode of the eleventh TFT, a gate electrode of the eleventh TFT is connected with the second node, and a drain electrode of the eleventh TFT is connected with an output end of the output module.

The constant low level voltage is sent to a source electrode of the twelfth TFT, the first control signal is sent to a gate electrode of the twelfth TFT, and a drain electrode of the twelfth TFT is connected with the output end of the output module.

In the GOA circuit of the present disclosure, the nth-stage GOA unit further comprises a reset module. The reset module comprises a thirteenth TFT; a reset signal is sent to a source electrode and a gate electrode of the thirteenth TFT, and a drain electrode of the thirteenth TFT is electrically connected with the second node.

The present disclosure provides a GOA circuit, where the GOA circuit uses an current leakage limiting module. The current leakage limiting module limits current leakage of a first node to maintain a high level of the first node when an embedded touch display panel enters a stage in which signal interruption occurs and touch scanning is performed, further reducing risk of cascaded failure and making the GOA circuit stable.

BRIEF DESCRIPTION OF DRAWINGS

In order to clearly describe the embodiment in the present disclosure or the prior art, the following will briefly introduce the drawings for the embodiment. Obviously, the following description is only a few embodiments, for common technical personnel in the field it is easy to acquire some other drawings without creative work.

DETAILED DESCRIPTION OF PREFERRED EMBODIMENTS

Figure 1:
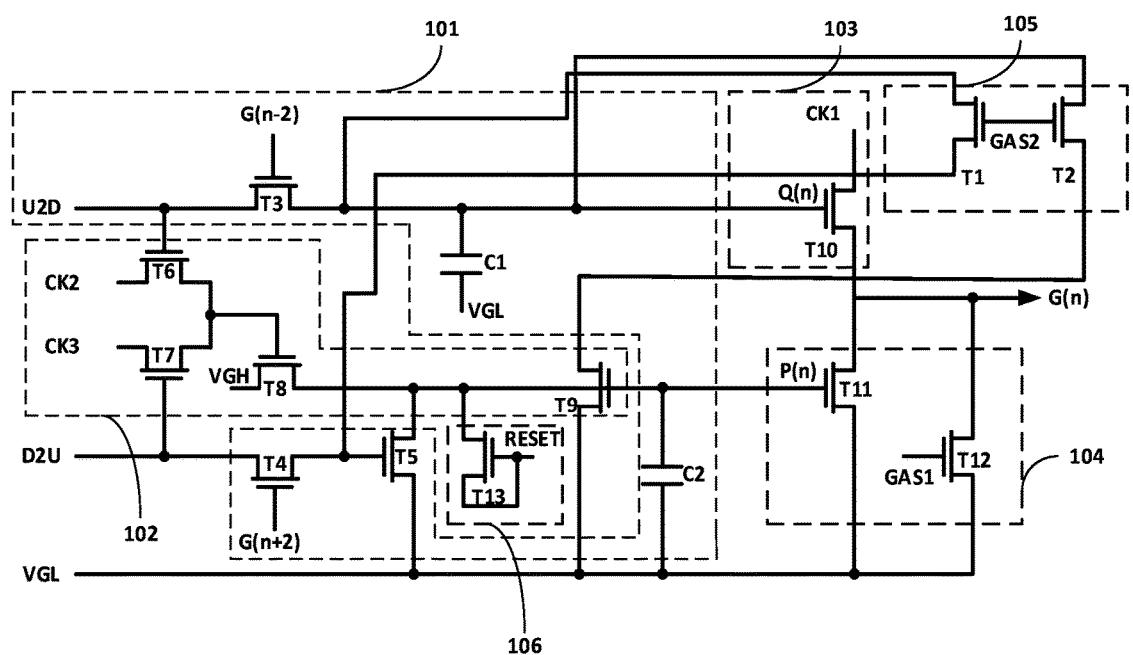
FIG. 1 is a circuit diagram of a gate driver on array (GOA) circuit according to a first embodiment of the present disclosure.

The following description of every embodiment, with reference to the accompanying drawings, is used to exemplify a specific every embodiment which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

FIG. 1 is a circuit diagram of a gate driver on array (GOA) circuit according to a first embodiment of the present disclosure. The GOA circuit comprises a plurality of cascaded stages of GOA units. An nth-stage GOA unit comprises a forward-and-reverse scanning control module 101, a node control module 102, an output module 103, an output control module 104, and a current leakage limiting module 105. It should be understood that the nth-stage GOA unit is not a first-stage GOA unit, a second-stage GOA unit, a penultimate stage GOA unit, or a last-stage GOA unit.

The forward-and-reverse scanning control module 101 outputs a first node control signal to a first node Q(n) of the GOA circuit and outputs a second node control signal to a second node P(n) of the GOA circuit according to a forward scanning direct-current control signal U2D and a reverse scanning direct-current control signal D2U.

To be specific, the forward-and-reverse scanning control module 101 comprises a third TFT T3, a fourth TFT T4, a fifth TFT T5, a first capacitor C1, and a second capacitor C2. The forward scanning direct-current control signal U2D is sent to a source electrode of the third TFT T3, a scanning signal of an (n−2)th-stage GOA unit G(n−2) is sent to a gate electrode of the third TFT T3, and a drain electrode of the third TFT T3 is connected with the first node Q(n), a drain electrode of the fourth TFT T4, and a gate electrode of the fifth TFT T5. The reverse scanning direct-current control signal D2U is sent to a source electrode of the fourth TFT T4, and a scanning signal of an (n+2)th-stage GOA unit G(n+2) is sent to a gate electrode of the fourth TFT T4. The constant low level voltage is sent to a source electrode of the fifth TFT T5, and a drain electrode of the fifth TFT T5 is connected with the second node P(n). A first terminal of the first capacitor C1 is connected with the first node Q(n), and the constant low level voltage VGL is sent to a second terminal of the first capacitor C1. A first terminal of the second capacitor C2 is connected with the second node P(n), and the constant low level voltage VGL is sent to a second terminal of the second capacitor C2.

The node control module 102 is coupled to the first node Q(n) and the second node P(n). The node control module 102 pulls the first node control signal down to a constant low level voltage VGL, and pulls the second node control signal up to a constant high level voltage VGH.

The node control module 102 comprises a sixth TFT T6, a seventh TFT T7, an eighth TFT T8, and a ninth TFT T9. A second clock signal CK2 is sent to a source electrode of the sixth TFT T6, the forward scanning direct-current control signal U2D is sent to a gate electrode of the sixth TFT T6, and a drain electrode of the sixth TFT T6 is connected with a gate electrode of the eighth TFT T8. A third clock signal CK3 is sent to a source electrode of the seventh TFT T7, the reverse scanning direct-current control signal D2U is sent to a gate electrode of the seventh TFT T7, and a drain electrode of the seventh TFT T7 is connected with a gate electrode of the eighth TFT T8. The constant high level voltage VGH is sent to a source electrode of the eighth TFT T8, and a drain electrode of the eighth TFT T8 is connected with the second node P(n). The constant low level voltage VGL is sent to a source electrode of the ninth TFT T9, a gate electrode of the ninth TFT T9 is connected with the second node P(n), and a drain electrode of the ninth TFT T9 is connected with the first node Q(n).

The output module 103 is coupled to the first node Q(n), and a first clock signal CK1 is sent to the output module 103. The output module 103 outputs a scanning signal G(n) according to the first node control signal and the first clock signal CK1.

To be specific, the output module 103 comprises a tenth TFT T10. The first clock signal CK1 is sent to a source electrode of the tenth TFT T10, a gate electrode of the tenth TFT T10 is connected with the first node Q(n), and a drain electrode of the tenth TFT T10 is connected with an output end of the output module 103.

A first control signal GAS1 is sent to the output control module 104, and the output control module 104 pulls the scanning signal down to a constant low level voltage VGL according to the first control signal GAS1.

To be specific, the output control module 104 comprises an eleventh TFT T11 and a twelfth TFT T12. The constant low level voltage VGL is sent to a source electrode of the eleventh TFT T11, a gate electrode of the eleventh TFT T11 is connected with the second node P(n), and a drain electrode of the eleventh TFT T11 is connected with an output end of the output module 103. The constant low level voltage VGL is sent to a source electrode of the twelfth TFT, the first control signal GAS1 is sent to a gate electrode of the twelfth TFT T12, and a drain electrode of the twelfth TFT T12 is connected with the output end of the output module 103.

The current leakage limiting module 105 is coupled to the first node Q(n). The current leakage limiting module 105 limits current leakage of the first node Q(n) to maintain a high level of the first node Q(n) when the embedded touch display panel enters a stage in which signal interruption occurs and touch scanning is performed.

Figure 2:
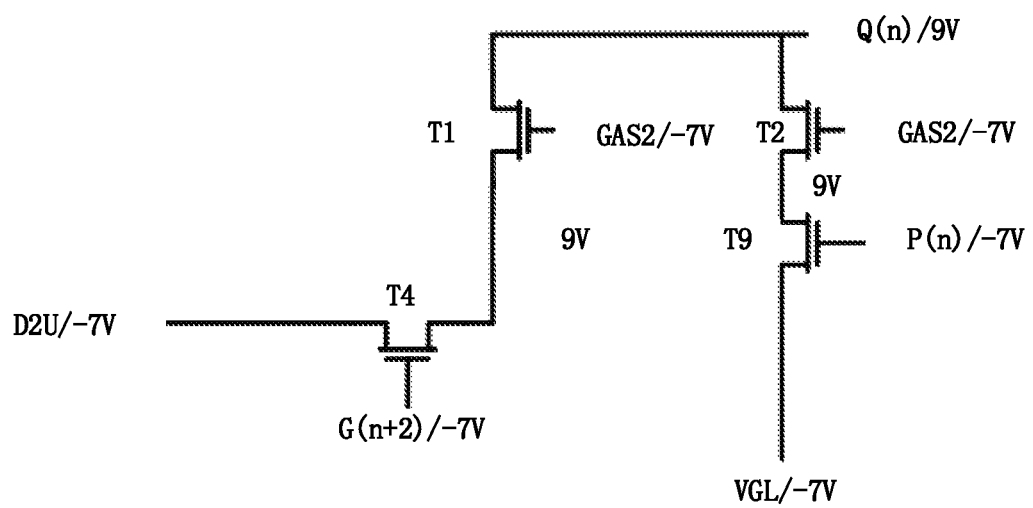
FIG. 2 is a current leakage diagram of the GOA circuit according to the first embodiment of the present disclosure.

FIG. 2 is an current leakage diagram of the GOA circuit according to the first embodiment of the present disclosure. The constant high level voltage is set as 9V, and the constant low level voltage is set as −7V. For example, the high level of the first node Q(n) tends to leak current to the low level of the reverse scanning direct-current control signal D2U along the first TFT T1 and the fourth TFT T4. The high level of the first node Q(n) tends to leak current to the constant low level voltage VGL along the second TFT T2 and the ninth TFT T9.

In the embodiment, when the embedded touch display panel displays normally, the second control signal GAS2 is at a high level to turn on the first TFT T1 and the second TFT T2, and the GOA works normally. When the embedded touch display panel enters the stage in which signal interruption occurs and touch scanning is performed, the second control signal GAS2 is at a low level to turn off the first TFT T1 and the second TFT T2 to interdict current leakage of the first node Q(n).

To be specific, the current leakage limiting module 105 comprises the first TFT T1 and a second TFT T2. A second control signal GAS2 is sent to gate electrodes of the first TFT T1 and the second TFT T2. Source electrodes of the first TFT T1 and the second TFT T2 are electrically connected with the first node Q(n). The reverse scanning direct-current control signal D2U is sent to a drain electrode of the first TFT T1 and the constant low level voltage VGL is sent to a drain electrode of the second TFT T2.

Furthermore, the nth-stage GOA unit further comprises a reset module 106. The reset module 106 comprises a thirteenth TFT T13. A reset signal RESET is sent to a source electrode and a gate electrode of the thirteenth TFT T13, and a drain electrode of the thirteenth TFT T13 is electrically connected with the second node P(n). It should be noticed that the reset module 106 is configured to reset the GOA circuit to make the GOA circuit stable when the GOA circuit works.

Figure 3:
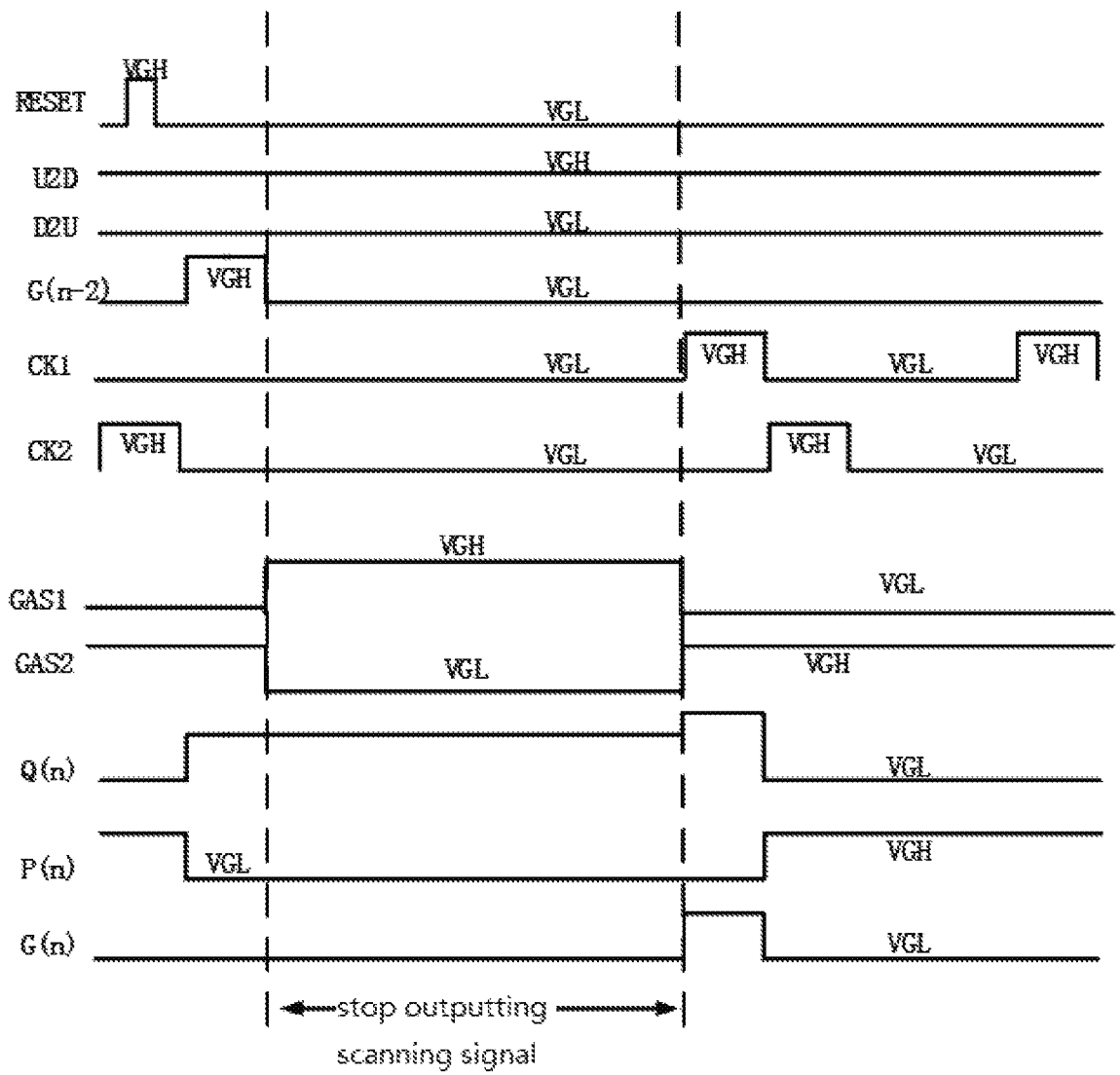
FIG. 3 is a timing diagram of the GOA circuit according to the first embodiment of the present disclosure.

Combining FIG. 1 with FIG. 3, take the GOA circuit of the first embodiment of the present disclosure preforming forward scanning for example, a specific work process of the GOA circuit of the present disclosure is noticed. FIG. 3 is a timing diagram of the GOA circuit according to the first embodiment of the present disclosure.

As shown in FIG. 1 and FIG. 3, the first control signal GAS1 is at the low level and the second control signal GAS2 is at the high level when the embedded touch display panel displays normally. When the embedded touch display panel enters the stage in which signal interruption occurs and touch scanning is performed, the first control signal GAS1 is at the high level and the second control signal GAS2 is at the low level. When the GOA circuit performs forward scanning, the forward scanning direct-current control signal U2D is at the high level, and the reverse scanning direct-current control signal D2U is at the low level. When the GOA circuit performs reverse scanning, the forward scanning direct-current control signal U2D is the low level, and the reverse scanning direct-current control signal D2U is the high level.

Combining FIG. 1 with FIG. 3, when the GOA circuit works, a scanning signal G(n−2) of an (n+2)th-stage GOA unit is at the high level, and the third TFT T3 turns on. The forward-and-reverse scanning control module U2D at the high level outputs a first node control signal to the first node Q(n) through the third TFT T3 and the high level of the first node control signal is stored in the first capacitor C1. At the same time, the fifth TFT T5 turns on, the constant low level voltage VGL outputs a second node control signal to the second node P(n) through the fifth TFT T5 and the low level of the second node control signal is stored in the second capacitor C2.

When the embedded touch display panel enters a stage in which signal interruption occurs and touch scanning is performed, the first node control signal is maintained at the high level and the second node control signal is maintained at the low level, and the first clock signal CK1 is at the low level. At this time, the tenth TFT T10 turns on, the first clock signal CK1 at the low level is sent to an output end of the output module 103 through the tenth TFT T10, and the scanning signal G(n) is the low level.

The present disclosure provides the current leakage limiting module 105, the current leakage limiting module limits current leakage of the first node Q(n) to maintain the high level of the first node Q(n) when the embedded touch display panel enters the stage in which signal interruption occurs and touch scanning is performed. After that, the first node Q(n) is maintained at the constant high level VGH to reduce risk of cascaded failure of the GOA circuit and make the GOA circuit stable.

To be specific, combining FIG. 1 with FIG. 3, when the embedded touch display panel enters the stage in which signal interruption occurs and touch scanning is performed, the second control signal GAS 2 is at the low level, the first TFT T1 and the second TFT T2 turn off to interdict current leakage of the first node Q(n), further reducing risk of cascaded failure of the GOA circuit and making the GOA circuit stable.

When the embedded touch display panel finishes one touch scanning, the first clock signal CK1 is at the high level to pull the level of the first node control signal of the first node Q(n) up. At the same time, the second node control signal of the second node P(n) is maintained at the constant voltage low level, and the scanning signal G(n) of the (n)th-stage GOA unit is at the high level.

When the second clock signal CK2 is at the high level, the first node control signal of the first node Q(n) is pulled down to the constant low level voltage VGL, the second node control signal of the second node P(n) is pulled up to the constant high level voltage VGH, and the scanning signal G(n) of the (n)th-stage GOA unit is at the low level.

Figure 4:
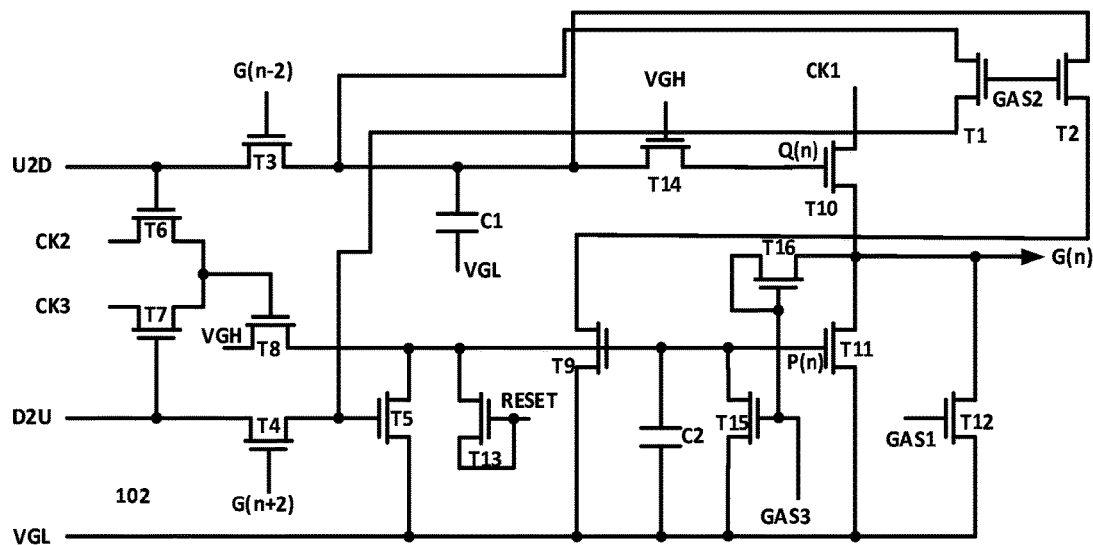
FIG. 4 is another circuit diagram of the GOA circuit according to the first embodiment of the present disclosure.

FIG. 4 is another circuit diagram of the GOA circuit according to the first embodiment of the present disclosure. A difference between the GOA circuit of FIG. 4 and the GOA circuit of FIG. 1 is that: the GOA circuit further comprises a fourteenth TFT T14, a fifteenth TFT T15, and a sixteenth TFT T16.

A source electrode of the fourteenth TFT T14 is connected with a drain electrode of the third TFT T3, the constant high level voltage VGH is sent to a gate electrode of the fourteenth TFT T14, and the first node Q(n) is connected with a drain electrode of the fourteenth TFT T14.

The constant low level voltage VGL is sent to a source electrode of the fifteenth TFT T15, a third control signal GAS3 is sent to a gate electrode of the fifteenth TFT T15, and the second node P(n) is connected with a drain electrode of the fifteenth TFT T15.

The third control signal GAS3 is sent to a source electrode and a gate electrode of the sixteenth TFT T16, and a drain electrode of the sixteenth TFT T16 is connected with the drain electrode of the tenth TFT T10.

When the GOA circuit of the present disclosure works, the constant voltage high voltage is sent to the gate electrode of the fourteenth TFT T14 to maintain the fourteenth TFT T14 at turn-on status.

When the GOA circuit of the present disclosure works, the third control signal GAS3 is sent to the gate electrodes of the fifteenth TFT T15 and the sixteenth TFT T16, and the third control signal GAS3 is at the constant low level voltage to maintain the fifteenth TFT T15 and the sixteenth TFT T16 at turn-off status.

In addition, the GOA circuit of the present disclosure can control status of the fourteenth TFT T14, the fifteenth TFT T15, and the sixteenth TFT T16 by adjusting level of signal sent to the fourteenth TFT T14, the fifteenth TFT T15, and the sixteenth TFT T16, further making the GOA circuit flexible.

Figure 5:
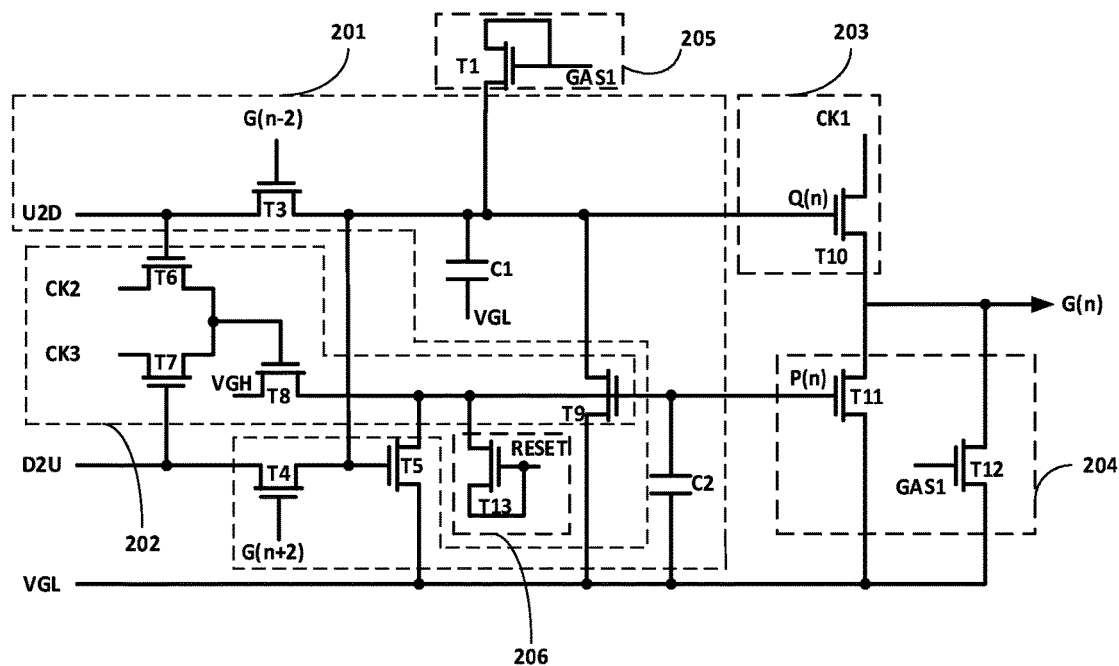
FIG. 5 is a circuit diagram of the GOA circuit according to a second embodiment of the present disclosure.

FIG. 5 is a circuit diagram of the GOA circuit according to a second embodiment of the present disclosure. The second embodiment of the present disclosure provides the GOA circuit, where the GOA circuit comprises a plurality of cascaded stages of GOA units. An nth-stage GOA unit comprises a forward-and-reverse scanning control module 201, a node control module 202, an output module 203, an output control module 204, and a current leakage limiting module 205. It should be understood that the nth-stage GOA unit is not a first-stage GOA unit, a second-stage GOA unit, a penultimate stage GOA unit, or a last stage GOA unit.

The forward-and-reverse scanning control module 201 outputs a first node control signal to a first node Q(n) and outputs a second node control signal to a second node P(n) according to a forward scanning direct-current control signal U2D and a reverse scanning direct-current control signal D2U.

To be specific, the forward-and-reverse scanning control module 201 comprises a third TFT T3, a fourth TFT T4, a fifth TFT T5, a first capacitor C1, and a second capacitor C2. The forward scanning direct-current control signal U2D is sent to a source electrode of the third TFT T3, a scanning signal of an (n−2)th-stage GOA unit G(n−2) is sent to a gate electrode of the third TFT T3, and a drain electrode of the third TFT T3 is connected with the first node Q(n), a drain electrode of the fourth TFT T4, and a gate electrode of the fifth TFT T5. The reverse scanning direct-current control signal D2U is sent to a source electrode of the fourth TFT T4, and a scanning signal of an (n+2)th-stage GOA unit G(n+2) is sent to a gate electrode of the fourth TFT T4. The constant low level voltage is sent to a source electrode of the fifth TFT T5, and a drain electrode of the fifth TFT T5 is connected with the second node P(n). A first terminal of the first capacitor C1 is connected with the first node Q(n), and the constant low level voltage VGL is sent to a second terminal of the first capacitor C1. A first terminal of the second capacitor C2 is connected with the second node P(n), and the constant low level voltage VGL is sent to a second terminal of the second capacitor C2.

The node control module 202 is coupled to the first node Q(n) and the second node P(n). The node control module 202 pulls the first node control signal down to a constant low level voltage VGL, and pulls the second node control signal up to a constant high level voltage VGH.

The node control module 202 comprises a sixth TFT T6, a seventh TFT T7, an eighth TFT T8, and a ninth TFT T9. A second clock signal CK2 is sent to a source electrode of the sixth TFT T6, the forward scanning direct-current control signal U2D is sent to a gate electrode of the sixth TFT T6, and a drain electrode of the sixth TFT T6 is connected with a gate electrode of the eighth TFT T8. A third clock signal CK3 is sent to a source electrode of the seventh TFT T7, the reverse scanning direct-current control signal D2U is sent to a gate electrode of the seventh TFT T7, and a drain electrode of the seventh TFT T7 is connected with a gate electrode of the eighth TFT T8. The constant high level voltage VGH is sent to a source electrode of the eighth TFT T8, and a drain electrode of the eighth TFT T8 is connected with the second node P(n). The constant low level voltage VGL is sent to a source electrode of the ninth TFT T9, a gate electrode of the ninth TFT T9 is connected with the second node P(n), and a drain electrode of the ninth TFT T9 is connected with the first node Q(n).

The output module 203 is coupled to the first node Q(n), and a first clock signal CK1 is sent to the output module 103. The output module 103 outputs a scanning signal G(n) according to the first node control signal and the first clock signal CK1.

To be specific, the output module 203 comprises a tenth TFT T10. The first clock signal CK1 is sent to a source electrode of the tenth TFT T10, a gate electrode of the tenth TFT T10 is connected with the first node Q(n), and a drain electrode of the tenth TFT T10 is connected with an output end of the output module 203.

A first control signal GAS1 is sent to the output control module 204, and the output control module 104 pulls the scanning signal down to a constant low level voltage VGL according to the first control signal GAS1.

To be specific, the output control module 204 comprises an eleventh TFT T11 and a twelfth TFT T12. The constant low level voltage VGL is sent to a source electrode of the eleventh TFT T11, a gate electrode of the eleventh TFT T11 is connected with the second node P(n), and a drain electrode of the eleventh TFT T11 is connected with an output end of the output module 203. The constant low level voltage VGL is sent to a source electrode of the twelfth TFT, the first control signal GAS1 is sent to a gate electrode of the twelfth TFT T12, and a drain electrode of the twelfth TFT T12 is connected with the output end of the output module 203.

The current leakage limiting module 205 is coupled to the first node Q(n). The current leakage limiting module 205 limits current leakage of the first node Q(n) to maintain a high level of the first node Q(n) when the embedded touch display panel enters a stage in which signal interruption occurs and touch scanning is performed.

Figure 6:
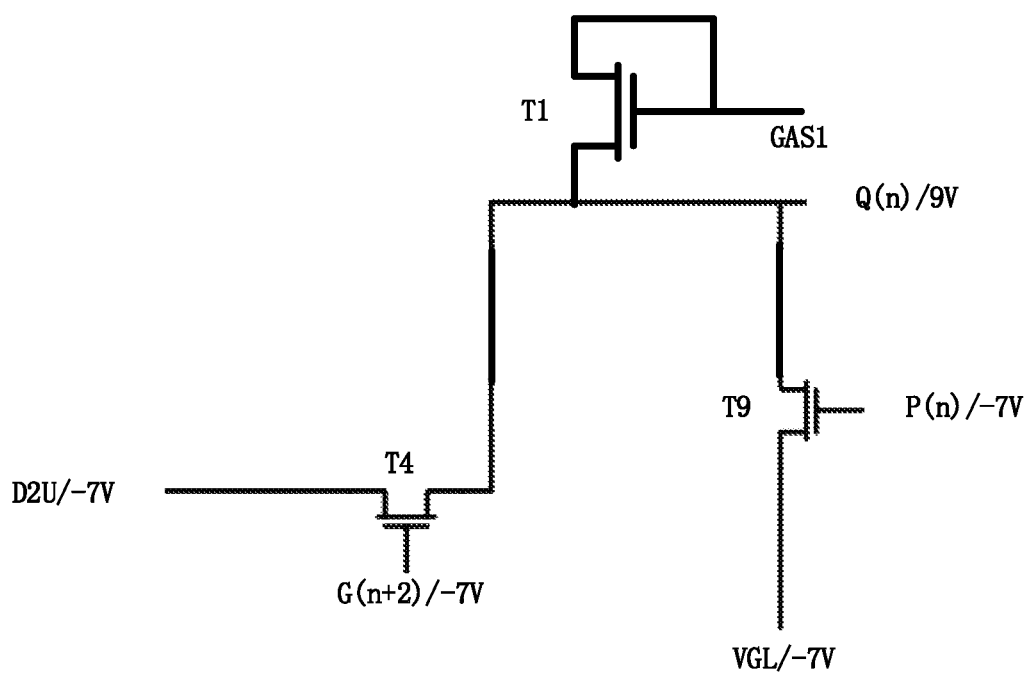
FIG. 6 is a current leakage diagram of the GOA circuit according to the second embodiment of the present disclosure.

It should be understood that FIG. 6 is a current leakage diagram of the GOA circuit according to the second embodiment of the present disclosure. The constant high level voltage is set as 9V, and the constant low level voltage is set as −7V. For example, the high level of the first node Q(n) tends to leak current to the low level of the reverse scanning direct-current control signal D2U along the fourth TFT T4. The high level of the first node Q(n) tends to leak current to the constant low level voltage VGL along the ninth TFT T9.

In the embodiment, when the embedded touch display panel displays normally, the first control signal GAS1 is at the low level to turn off the first TFT T1, and the GOA works normally. When the embedded touch display panel enters the stage in which signal interruption occurs and touch scanning is performed, the first control signal GAS1 is at a high level to turn on the first TFT T1 to limit current leakage of the first node Q(n).

To be specific, the current leakage limiting module 105 comprises the first TFT T1. A first control signal GAS1 is sent to a source electrode and a drain electrode of the first TFT T1. A drain electrode of the first TFT T1 is electrically connected with the first node Q(n).

Furthermore, the nth-stage GOA unit further comprises a reset module 106. The reset module 106 comprises a thirteenth TFT T13. A reset signal RESET is sent to a source electrode and a gate electrode of the thirteenth TFT T13, and a drain electrode of the thirteenth TFT T13 is electrically connected with the second node P(n). It should be noticed that the reset module 106 is configured to reset the GOA circuit to make the GOA circuit stable when the GOA circuit works.

Figure 7:
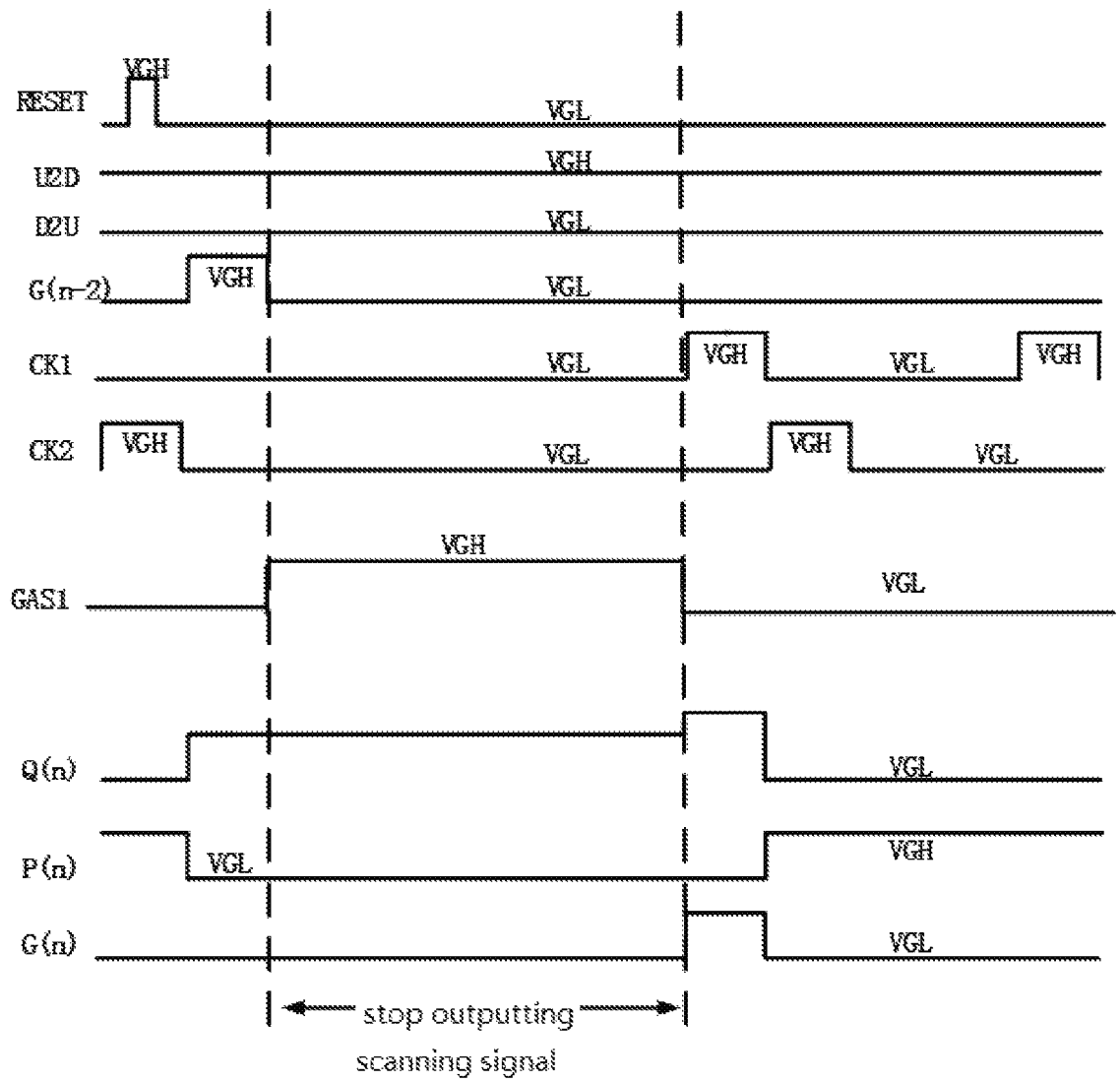
FIG. 7 is a timing diagram of the GOA circuit according to the second embodiment of the present disclosure.

Combining FIG. 5 with FIG. 7, take the GOA circuit of the second embodiment of the present disclosure preforming forward scanning for example, a specific work process of the GOA circuit of the present disclosure is noticed. FIG. 7 is a timing diagram of the GOA circuit according to the second embodiment of the present disclosure.

As shown in FIG. 5 and FIG. 7, the first control signal GAS1 is at the low level when the embedded touch display panel displays normally. When the embedded touch display panel enters the stage in which signal interruption occurs and touch scanning is performed, the first control signal GAS1 is at the high level. When the GOA circuit performs forward scanning, the forward scanning direct-current control signal U2D is at the high level, and the reverse scanning direct-current control signal D2U is the low level. When the GOA circuit performs reverse scanning, the forward scanning direct-current control signal U2D is the low level, and the reverse scanning direct-current control signal D2U is the high level.

Combining FIG. 5 with FIG. 7, when the GOA circuit works, a scanning signal G(n–2) of an (n+2)th-stage GOA unit is at the high level, the third TFT T3 turns on. The forward-and-reverse scanning control module U2D at the high level outputs a first node control signal to the first node Q(n) through the third TFT T3 and the high level of the first node control signal is stored in the first capacitor C1. At the same time, the fifth TFT T5 turns on, the constant low level voltage VGL outputs a second node control signal to the second node P(n) through the fifth TFT T5 and the low level of the second node control signal is stored in the second capacitor C2.

When the embedded touch display panel enters a stage in which signal interruption occurs and touch scanning is performed, the first node control signal is maintained at the high level and the second node control signal is maintained at the low level, the first clock signal CK1 is at the low level. At this time, the tenth TFT T10 turns on, the first clock signal CK1 at the low level is sent to an output end of the output module 103 through the tenth TFT T10, the scanning signal G(n) is the low level.

The present disclosure provides the current leakage limiting module 105, the current leakage limiting module limits current leakage of the first node Q(n) to maintain the high level of the first node Q(n) when the embedded touch display panel enters the stage in which signal interruption occurs and touch scanning is performed. After that, the first node Q(n) is maintained at the constant high level VGH to reduce risk of cascaded failure of the GOA circuit and make the GOA circuit stable.

To be specific, as shown in FIG. 7, when the embedded touch display panel enters the stage in which signal interruption occurs and touch scanning is performed, the first control signal GAS1 is at the high level, the first TFT T1 turns on. The high level of the first control signal GAS 1 is supplemented to the first node Q(n) through the first TFT T1 to interdict current leakage of the first node Q(n), further reducing risk of cascaded failure of the GOA circuit and making the GOA circuit stable.

When the embedded touch display panel finishes one touch scanning, the first clock signal CK1 is at the high level to pull level of the first node control signal of the first node Q(n) up. At the same time, the second node control signal of the second node P(n) is maintained at the constant voltage low level, and the scanning signal G(n) of the (n)th-stage GOA unit is at the high level.

When the second clock signal CK2 is at the high level, the first node control signal of the first node Q(n) is pulled down to the constant low level voltage VGL, the second node control signal of the second node P(n) is pulled up to the constant high level voltage VGH, and the scanning signal G(n) of the (n)th-stage GOA unit is at the low level.

Figure 8:
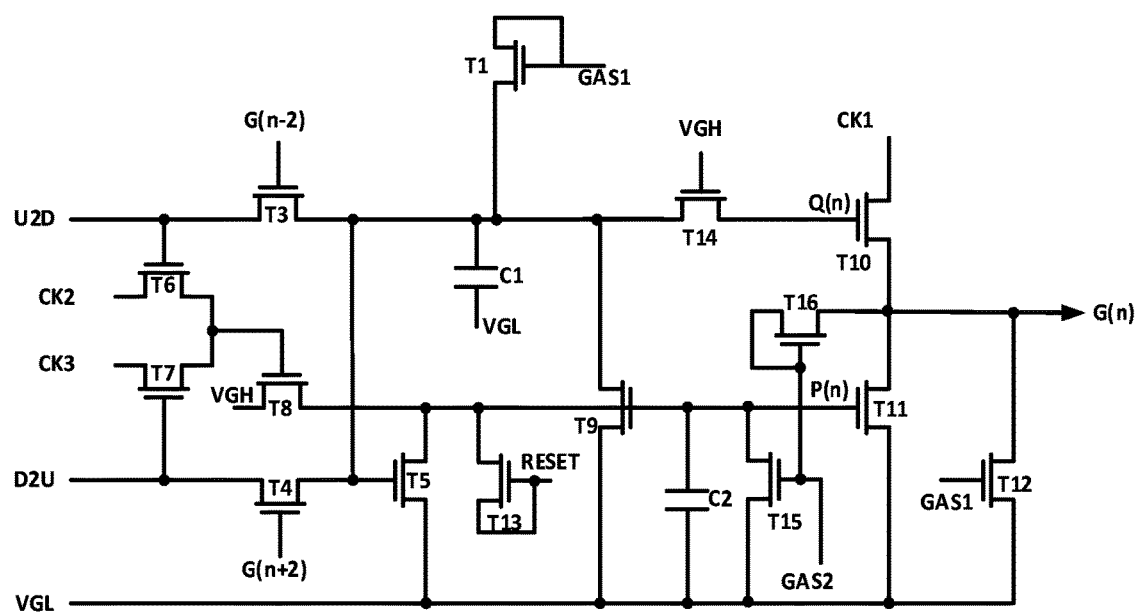
FIG. 8 is another circuit diagram of the GOA circuit according to the second embodiment of the present disclosure.

FIG. 8 is another circuit diagram of the GOA circuit according to the first embodiment of the present disclosure. A difference between the GOA circuit of FIG. 8 and the GOA circuit of FIG. 1 is that: the GOA circuit further comprises a fourteenth TFT T14, a fifteenth TFT T15, and a sixteenth TFT T16.

A source electrode of the fourteenth TFT T14 is connected with a drain electrode of the third TFT T3, the constant high level voltage VGH is sent to a gate electrode of the fourteenth TFT T14, and the first node Q(n) is connected with a drain electrode of the fourteenth TFT T14.

The constant low level voltage VGL is sent to a source electrode of the fifteenth TFT T15, a second control signal GAS2 is sent to a gate electrode of the fifteenth TFT T15, and the second node P(n) is connected with a drain electrode of the fifteenth TFT T15.

The second control signal GAS2 is sent to a source electrode and a gate electrode of the sixteenth TFT T16, and a drain electrode of the sixteenth TFT T16 is connected with the drain electrode of the tenth TFT T10.

When the GOA circuit of the present disclosure works, the constant voltage high voltage is sent to the gate electrode of the fourteenth TFT T14 to maintain the fourteenth TFT T14 at turn-on status.

When the GOA circuit of the present disclosure works, the second control signal GAS2 is sent to the gate electrodes of the fifteenth TFT T15 and the sixteenth TFT T16, and the second control signal GAS2 is at the constant low level voltage to maintain the fifteenth TFT T15 and the sixteenth TFT T16 at turn-off status.

In addition, the GOA circuit of the present disclosure can control status of the fourteenth TFT T14, the fifteenth TFT T15, and the sixteenth TFT T16 by adjusting level of signal sent to the fourteenth TFT T14, the fifteenth TFT T15, and the sixteenth TFT T16, further making the GOA circuit flexible.

The present disclosure provides a GOA circuit, where the GOA circuit uses a current leakage limiting module. The current leakage limiting module limits current leakage of a first node to maintain a high level of the first node when an embedded touch display panel enters a stage in which signal interruption occurs and touch scanning is performed, further reducing the risk of cascaded failure and making the GOA circuit stable.

The liquid display module provided in the embodiments of the present disclosure is described in detail above. The present disclosure uses specific embodiments to describe the principle and implementation way of the present disclosure. It should be understood that the present disclosure has been described with reference to certain preferred and alternative embodiments which are intended to be exemplary only and do not limit the full scope of the present disclosure as set forth in the appended claims.

What is claimed is:

1. A gate driver on array (GOA) circuit configured to be applied to an embedded touch display panel, comprising:
a plurality of cascaded stages of GOA units;
wherein an nth-stage GOA unit comprises a forward-and-reverse scanning control module, a node control module, an output module, an output control module, and a current leakage limiting module;
wherein the forward-and-reverse scanning control module outputs a first node control signal to a first node of the GOA circuit and outputs a second node control signal to a second node of the GOA circuit according to a forward scanning direct-current control signal and a reverse scanning direct-current control signal;
wherein the node control module is coupled to the first node and the second node; the node control module pulls the first node control signal down to a constant voltage low level, and pulls the second node control signal up to a constant high level voltage;
wherein the output module is coupled to the first node, and a first clock signal is sent to the output module; the output module outputs a scanning signal according to the first node control signal and the first clock signal;
wherein a first control signal is sent to the output control module, the output control module pulls the scanning signal down to a constant low level voltage according to the first control signal;
wherein the current leakage limiting module is coupled to the first node; the current leakage limiting module limits current leakage of the first node to maintain a high level of the first node when the embedded touch display panel enters a stage in which signal interruption occurs and touch scanning is performed;
wherein the output module comprises a tenth thin film transistor (TFT); the first clock signal is sent to a source electrode of the tenth TFT, a gate electrode of the tenth TFT is connected with the first node, and a drain electrode of the tenth TFT is connected with an output end of the output module.

2. The GOA circuit as claimed in claim 1, wherein the current leakage limiting module comprises a first TFT and a second TFT;
wherein a second control signal is sent to gate electrodes of the first TFT and the second TFT; source electrodes of the first TFT and the second TFT are electrically connected with the first node;
wherein the reverse scanning direct-current control signal is sent to a drain electrode of the first TFT; the constant low level voltage is sent to a drain electrode of the second TFT.

3. The GOA circuit as claimed in claim 2, wherein when the embedded touch display panel displays normally, the second control signal is at a high level; when the embedded touch display panel enters the stage in which signal interruption occurs and touch scanning is performed, the second control signal is at a low level.

4. The GOA circuit as claimed in claim 1, wherein the current leakage limiting module comprises a first TFT;
wherein the first control signal is sent to the source electrode and the drain electrode of the first TFT, and the drain electrode of the first TFT is electrically connected with the first node.

5. The GOA circuit as claimed in claim 4, wherein when the embedded touch display panel displays normally, the first control signal is at the low level; when the embedded touch display panel enters the stage in which signal interruption occurs and touch scanning is performed, the first control signal is at the high level.

6. The GOA circuit as claimed in claim 1, wherein the forward-and-reverse scanning control module comprises a third TFT, a fourth TFT, a fifth TFT, a first capacitor, and a second capacitor;
wherein the forward scanning direct-current control signal is sent to a source electrode of the third TFT, a scanning signal of an (n−2)th-stage GOA unit is sent to a gate electrode of the third TFT, and a drain electrode of the third TFT is connected with the first node, a drain electrode of the fourth TFT, and a gate electrode of the fifth TFT;
wherein the reverse scanning direct-current control signal is sent to a source electrode of the fourth TFT, and a scanning signal of an (n+2)th-stage GOA unit is sent to a gate electrode of the fourth TFT;
wherein the constant low level voltage is sent to a source electrode of the fifth TFT, and a drain electrode of the fifth TFT is connected with the second node;
wherein a first terminal of the first capacitor is connected with the first node, and the constant low level voltage is sent to a second terminal of the first capacitor;
wherein a first terminal of the second capacitor is connected with the second node, and the constant low level voltage is sent to a second terminal of the second capacitor.

7. The GOA circuit as claimed in claim 1, wherein the node control module comprises a sixth TFT, a seventh TFT, an eighth TFT, and a ninth TFT;
wherein a second clock signal is sent to a source electrode of the sixth TFT, the forward scanning direct-current control signal is sent to a gate electrode of the sixth TFT, and a drain electrode of the sixth TFT is connected with a gate electrode of the eighth TFT;
wherein a third clock signal is sent to a source electrode of the seventh TFT, the reverse scanning direct-current control signal is sent to a gate electrode of the seventh TFT, and a drain electrode of the seventh TFT is connected with a gate electrode of the eighth TFT;
wherein the constant high level voltage is sent to a source electrode of the eighth TFT, and a drain electrode of the eighth TFT is connected with the second node;
wherein the constant low level voltage is sent to a source electrode of the ninth TFT, a gate electrode of the ninth TFT is connected with the second node, and a drain electrode of the ninth TFT is connected with the first node.

8. The GOA circuit as claimed in claim 4, wherein the output control module comprises an eleventh TFT and a twelfth TFT;
wherein the constant low level voltage is sent to a source electrode of the eleventh TFT, a gate electrode of the eleventh TFT is connected with the second node, and a drain electrode of the eleventh TFT is connected with an output end of the output module;
wherein the constant low level voltage is sent to a source electrode of the twelfth TFT, the first control signal is sent to a gate electrode of the twelfth TFT, and a drain electrode of the twelfth TFT is connected with the output end of the output module.

9. The GOA circuit as claimed in claim 4, wherein the nth-stage GOA unit further comprises a reset module; wherein the reset module comprises a thirteenth TFT; a reset signal is sent to a source electrode and a gate electrode of the thirteenth TFT, and a drain electrode of the thirteenth TFT is electrically connected with the second node.

10. A gate driver on array (GOA) circuit applying to an embedded touch display panel, comprising:
    a plurality of cascaded stages of GOA units;
    wherein an Nth-stage GOA unit comprises a forward-and-reverse scanning control module, a node control module, an output module, an output control module, and an current leakage limiting module;
    wherein the forward-and-reverse scanning control module outputs a first node control signal to a first node of the GOA circuit and outputs a second node control signal to a second node of the GOA circuit according to a forward scanning direct-current control signal and a reverse scanning direct-current control signal;
    wherein the node control module is coupled to the first node and the second node; the node control module pulls the first node control signal down to a constant voltage low level, and pulls the second node control signal up to a constant high level voltage;
    wherein the output module is coupled to the first node, and a first clock signal is sent to the output module; the output module outputs a scanning signal according to the first node control signal and the first clock signal;
    wherein a first control signal is sent to the output control module, the output control module pulls the scanning signal down to a constant low level voltage according to the first control signal;
    wherein the current leakage limiting module is coupled to the first node; the current leakage limiting module limits current leakage of the first node to maintain a high level of the first node when the embedded touch display panel enters a stage in which signal interruption occurs and touch scanning is performed.

11. The GOA circuit as claimed in claim 10, wherein the current leakage limiting module comprises a first TFT and a second TFT;
    wherein a second control signal is sent to gate electrodes of the first TFT and the second TFT; source electrodes of the first TFT and the second TFT are electrically connected with the first node;
    wherein the reverse scanning direct-current control signal is sent to a drain electrode of the first TFT; the constant low level voltage is sent to a drain electrode of the second TFT.

12. The GOA circuit as claimed in claim 11, wherein when the embedded touch display panel displays normally, the second control signal is at a high level; when the embedded touch display panel enters the stage in which signal interruption occurs and touch scanning is performed, the second control signal is at a low level.

13. The GOA circuit as claimed in claim 10, wherein the current leakage limiting module comprises a first TFT;
    wherein the first control signal is sent to the source electrode and the drain electrode of the first TFT, and the drain electrode of the first TFT is electrically connected with the first node.

14. The GOA circuit as claimed in claim 13, wherein when the embedded touch display panel displays normally, the first control signal is at the low level; when the embedded touch display panel enters the stage in which signal interruption occurs and touch scanning is performed, the first control signal is at the high level.

15. The GOA circuit as claimed in claim 10, wherein the forward-and-reverse scanning control module comprises a third TFT, a fourth TFT, a fifth TFT, a first capacitor, and a second capacitor;
    wherein the forward scanning direct-current control signal is sent to a source electrode of the third TFT, a scanning signal of an (n−2)th-stage GOA unit is sent to a gate electrode of the third TFT, and a drain electrode of the third TFT is connected with the first node, a drain electrode of the fourth TFT, and a gate electrode of the fifth TFT;
    wherein the reverse scanning direct-current control signal is sent to a source electrode of the fourth TFT, and a scanning signal of an (n+2)th-stage GOA unit is sent to a gate electrode of the fourth TFT;
    wherein the constant low level voltage is sent to a source electrode of the fifth TFT, and a drain electrode of the fifth TFT is connected with the second node;
    wherein a first terminal of the first capacitor is connected with the first node, and the constant low level voltage is sent to a second terminal of the first capacitor;
    wherein a first terminal of the second capacitor is connected with the second node, and the constant low level voltage is sent to a second terminal of the second capacitor.

16. The GOA circuit as claimed in claim 10, wherein the node control module comprises a sixth TFT, a seventh TFT, an eighth TFT, and a ninth TFT;
    wherein a second clock signal is sent to a source electrode of the sixth TFT, the forward scanning direct-current control signal is sent to a gate electrode of the sixth TFT, and a drain electrode of the sixth TFT is connected with a gate electrode of the eighth TFT;
    wherein a third clock signal is sent to a source electrode of the seventh TFT, the reverse scanning direct-current control signal is sent to a gate electrode of the seventh TFT, and a drain electrode of the seventh TFT is connected with a gate electrode of the eighth TFT;
    wherein the constant high level voltage is sent to a source electrode of the eighth TFT, and a drain electrode of the eighth TFT is connected with the second node;
    wherein the constant low level voltage is sent to a source electrode of the ninth TFT, a gate electrode of the ninth TFT is connected with the second node, and a drain electrode of the ninth TFT is connected with the first node.

17. The GOA circuit as claimed in claim 10, wherein the output control module comprises an eleventh TFT and a twelfth TFT;
    wherein the constant low level voltage is sent to a source electrode of the eleventh TFT, a gate electrode of the eleventh TFT is connected with the second node, and a drain electrode of the eleventh TFT is connected with an output end of the output module;
    wherein the constant low level voltage is sent to a source electrode of the twelfth TFT, the first control signal is sent to a gate electrode of the twelfth TFT, and a drain electrode of the twelfth TFT is connected with the output end of the output module.

18. The GOA circuit as claimed in claim 10, wherein the nth-stage GOA unit further comprises a reset module; wherein the reset module comprises a thirteenth TFT; a reset signal is sent to a source electrode and a gate electrode of the thirteenth TFT, and a drain electrode of the thirteenth TFT is electrically connected with the second node.

* * * * *